US012787304B2

(12) United States Patent
Kim et al.

(10) Patent No.: US 12,787,304 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventors: Hodae Kim, Suwon-si (KR); Hwan Kim, Suwon-si (KR); Kyudong Park, Suwon-si (KR); Seulji Song, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 372 days.

(21) Appl. No.: 18/535,198

(22) Filed: Dec. 11, 2023

(65) Prior Publication Data

US 2024/0244851 A1 Jul. 18, 2024

(30) Foreign Application Priority Data

Jan. 12, 2023 (KR) ........................ 10-2023-0004822

(51) Int. Cl.
*H10B 63/00* (2023.01)
*H10N 70/00* (2023.01)

(52) U.S. Cl.
CPC ....... *H10B 63/845* (2023.02); *H10N 70/8822* (2023.02); *H10N 70/8825* (2023.02); *H10N 70/8828* (2023.02)

(58) Field of Classification Search
CPC ........... H10N 70/8822; H10N 70/8825; H10N 70/8828; H10N 70/20; H10N 70/231; H10N 70/253; H10N 70/823; H10N 70/882; H10N 70/883; H10N 70/8836; H10N 70/884; H10N 70/8845; H10N 70/826; H10N 70/828; H10N 70/841; H10N 70/8413; H10N 79/00; H10B 63/10; H10B 63/24; H10B 63/84; H10B 63/30; H10B 63/845; H10B 99/10; H10B 41/10; H10B 41/20; H10B 41/27; H10B 41/30; H10B 41/35; H10B 41/40; H10B 43/10; H10B 43/23; H10B 43/27; H10B 43/30; H10B 43/35; H10B 43/50
USPC ............................ 257/4, 329, 314, 318, 506
See application file for complete search history.

(56) References Cited

U.S. PATENT DOCUMENTS

| | | | |
|---|---|---|---|
| 10,096,655 | B1 | 10/2018 | Pellizzer et al. |
| 10,461,125 | B2 | 10/2019 | Firovano et al. |
| 10,593,730 | B1 | 3/2020 | Conti et al. |
| 10,727,278 | B2 | 7/2020 | Imamura |

(Continued)

*Primary Examiner* — Natalia A Gondarenko
(74) *Attorney, Agent, or Firm* — Morgan, Lewis & Bockius LLP

(57) ABSTRACT

A semiconductor device includes a stack structure that includes horizontal conductive layers and interlayer insulating layers that are alternately stacked with each other in a first direction, vertical conductive layers that pass through the stack structure and extend in the first direction, where the vertical conductive layers have a pillar shape, selector layers that surround external surfaces of the vertical conductive layers, where the selector layers include a chalcogenide material, and first isolation layers that divide the horizontal conductive layers from each other and pass through the stack structure and between the vertical conductive layers adjacent to each other in a second direction that is perpendicular to the first direction. Ends of the first isolation layers in the second direction are in contact with external surfaces of the selector layers.

20 Claims, 16 Drawing Sheets

100c

(56) References Cited

U.S. PATENT DOCUMENTS

| | | | | |
|---|---|---|---|---|
| 10,840,300 | B2 | 11/2020 | Hsu | |
| 10,930,707 | B2 | 2/2021 | Fratin et al. | |
| 2011/0140068 | A1* | 6/2011 | Ozawa | H10B 63/22 257/4 |
| 2019/0067571 | A1* | 2/2019 | Fratin | H10B 63/845 |
| 2020/0395408 | A1* | 12/2020 | Takahashi | H10B 63/845 |
| 2022/0013535 | A1* | 1/2022 | Lue | H10B 43/27 |
| 2022/0190032 | A1* | 6/2022 | Redaelli | H10N 70/8828 |
| 2023/0061925 | A1* | 3/2023 | Jiang | H10B 41/20 |

* cited by examiner

SEMICONDUCTOR DEVICE

CROSS-REFERENCE TO RELATED APPLICATION(S)

This application claims priority under 35 U.S.C. 119 from Korean Patent Application No. 10-2023-0004822, filed on Jan. 12, 2023 in the Korean Intellectual Property Office, the contents of which are herein incorporated by reference in their entirety.

TECHNICAL FIELD

Embodiments of the present inventive concept are directed to a semiconductor device.

DISCUSSION OF THE RELATED ART

Semiconductor devices capable of storing high-capacity data are in demand. Accordingly, methods of increasing a data storage capacity of a semiconductor device have been researched. For example, as a method of increasing data storage capacity of a semiconductor device, a semiconductor device that includes three-dimensionally arranged memory cells, instead of two-dimensionally arranged memory cells, has been proposed.

SUMMARY

An embodiment of the present inventive concept provides a semiconductor device having an increased degree of integration and reliability.

According to an embodiment of the present inventive concept, there is provided a semiconductor device that includes a stack structure that includes horizontal conductive layers and interlayer insulating layers that are alternately stacked with each other in a first direction, vertical conductive layers that pass through the stack structure and extend in the first direction, where the vertical conductive layers have a pillar shape, selector layers that surround external surfaces of the vertical conductive layers, where the selector layers include a chalcogenide material, and first isolation layers that divide the horizontal conductive layers from each other and pass through the stack structure between vertical conductive layers that are adjacent to each other in a second direction that is perpendicular to the first direction. Ends of the first isolation layers in the second direction are in contact with external surfaces of the selector layers.

According to another embodiment of the present inventive concept, there is provided a semiconductor device that includes horizontal conductive layers and interlayer insulating layers that are alternately stacked with each other in a first direction, vertical structures that pass through the stack structure and extend in the first direction, where the vertical structures include a selector layer and a vertical conductive layer that are sequentially disposed from the horizontal conductive layers, and isolation layers that extending in a second direction that is perpendicular to the first direction, where the isolation layers divide the horizontal conductive layers from each other. The isolation layers are spaced apart from each other with the vertical structures interposed therebetween and between the vertical structures arranged in a row in the second direction.

According to another embodiment of the present inventive concept, there is provided a semiconductor device that includes a stack structure that includes horizontal conductive layers and interlayer insulating layers that are alternately stacked with each other in a first direction, vertical structures that pass through the stack structure and extend in the first direction, where the vertical structures including a selector layer and a vertical conductive layer that are sequentially disposed from the horizontal conductive layers, and isolation layers that extend in a second direction that is perpendicular to the first direction and between adjacent vertical structures. The isolation layers divide the horizontal conductive layers into sequentially disposed first to fourth sub conductive layers. The first and third sub conductive layers are electrically connected to each other, and the second and fourth conductive layers are electrically connected to each other.

DETAILED DESCRIPTION

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, embodiments of the present inventive concept will be described below with reference to the accompanying drawings.

Figure 1:
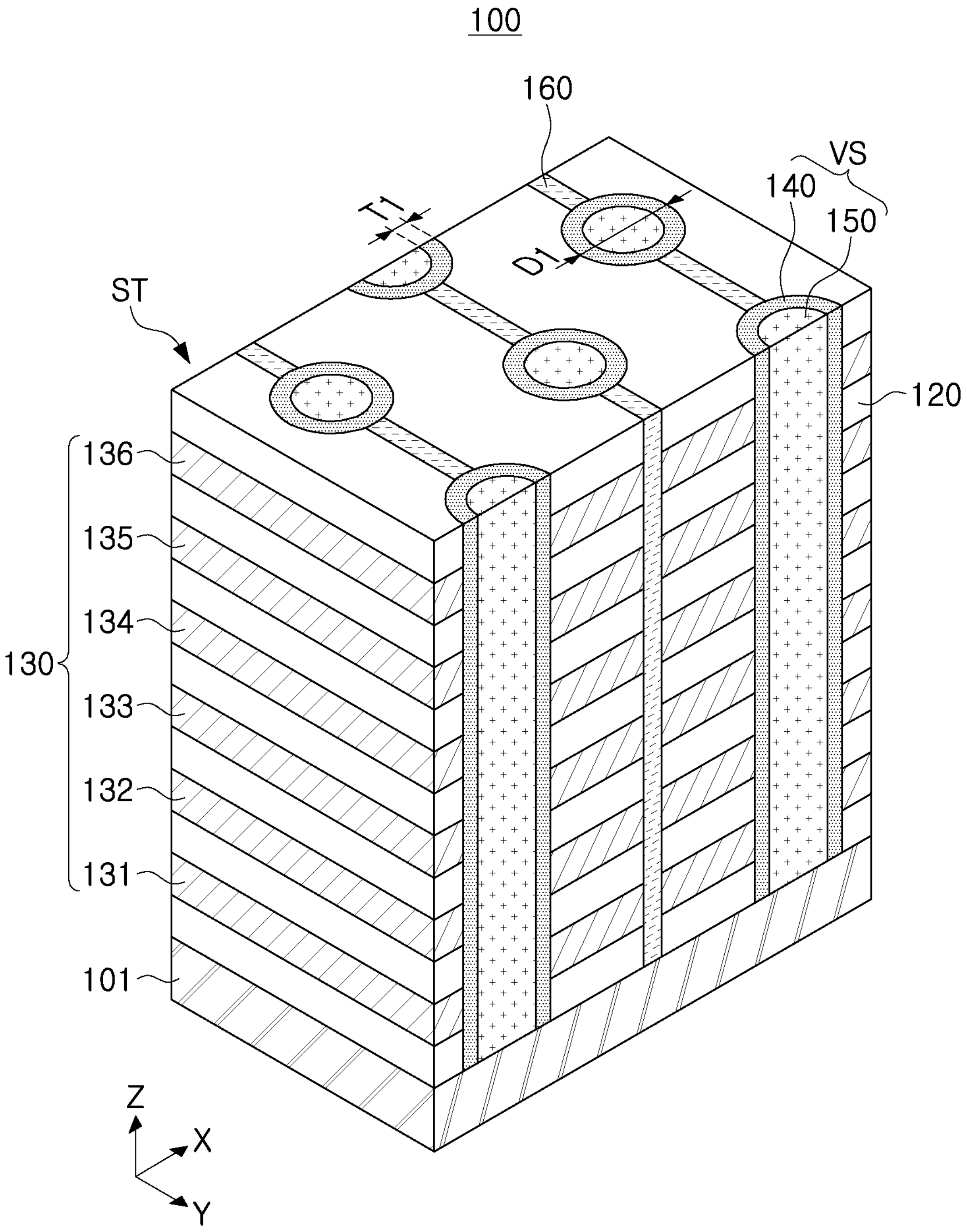
FIG. 1 is a schematic perspective view of a semiconductor device according to embodiments.

FIG. 1 is a schematic perspective view of a semiconductor device according to embodiments.

Referring to FIG. 1, in an embodiment, a semiconductor device 100 includes a substrate 101, horizontal conductive layers 130 stacked on the substrate 101, interlayer insulating layers 120 alternately stacked with the horizontal conductive layers 130 on the substrate 101, vertical structures VS that pass through a stack structure ST of the horizontal conductive layers 130 and the interlayer insulating layers 120, where the vertical structures VS respectively include a selector layer 140 and a vertical conductive layer 150, and isolation layers 160 that isolate the horizontal conductive layers 130 from each other and extend through the stack structure ST between adjacent vertical structures VS.

In the semiconductor device 100, memory cells are formed in regions in which the horizontal conductive layers 130 and the vertical conductive layers 150 intersect each other, and a plurality of memory cells are three-dimensionally arranged. The semiconductor device 100 may be a memory device that has a three-dimensional cross point array structure, and may be, for example, a selector only memory (SOM).

The substrate 101 has an upper surface that extends in an X-direction and a Y-direction. The X-direction and the Y-direction cross each other. The substrate 101 includes a semiconductor material, such as a Group IV semiconductor, a Group III-V compound semiconductor, or a Group II-VI compound semiconductor. For example, the Group IV semiconductor includes silicon, germanium, or silicon-germanium. The substrate 101 is provided as one of a bulk wafer, an epitaxial layer, an epitaxial layer, a silicon on insulator (SOI) layer, a semiconductor on insulator (SeOI) layer, etc.

The horizontal conductive layers 130, namely layers 131, 132, 133, 134, 145, and 136, are stacked on the substrate 101 and are vertically spaced apart from each other in a Z-direction that crosses the X- and Y-directions, and forms the stack structure ST together with the interlayer insulating layers 120. Each of the horizontal conductive layers 130 forms word planes or word lines that form a plurality of memory cells. In an embodiment, the horizontal conductive layers 130 are illustrated as six first to sixth horizontal conductive layers 131, 132, 133, 134, 145, and 136, but embodiments of the inventive concept are not necessarily limited thereto. In other embodiments, the number of vertically stacked horizontal conductive layers 130 can vary.

The horizontal conductive layers 130 include a conductive material such as a metal and/or a doped semiconductor. The metal includes, for example, tungsten (W). In some embodiments, the horizontal conductive layers 130 include polycrystalline silicon or a metal silicide material. In embodiments, the horizontal conductive layers 130 further include a diffusion barrier. For example, the diffusion barrier includes one of tungsten nitride (WN), tantalum nitride (TaN), titanium nitride (TiN), or combinations thereof.

The interlayer insulating layers 120 are disposed between the horizontal conductive layers 130. Similar to the horizontal conductive layers 130, the interlayer insulating layers 120 are spaced apart from each other in a direction that is perpendicular to an upper surface of the substrate 101, such as the Z-direction. The interlayer insulating layers 120 include an insulating material such as silicon oxide or silicon nitride.

The vertical structures VS pass through the stack structure ST and are disposed on the substrate 101 in rows and columns that are spaced apart from each other. As illustrated in FIG. 1, the vertical structures VS form a lattice pattern or to have a zigzag shape in one direction, on an X-Y plane. The vertical structures VS have a pillar shape that fills a vertical hole, and have an inclined side surface that becomes narrower as a distance to the substrate 101 decreases, depending on an aspect ratio. Each of the vertical structures VS includes the selector layer 140 and the vertical conductive layer 150. A diameter D1 of the vertical structure VS is, for example, in a range of about 20 nm to about 150 nm.

The selector layer 140 has an annular shape that surrounds an external surface of the internal vertical conductive layer 150. The selector layer 140 extends on the external surface of the vertical conductive layer 150 and surrounds the entire external surface. The selector layer 140 is disposed between the horizontal conductive layers 130 and the vertical conductive layer 150. External surfaces of the selector layer 140 are in direct contact with the horizontal conductive layers 130, and internal surfaces thereof are in direct contact with the vertical conductive layer 150.

The selector layer 140 simultaneously has memory properties that memorize a resistance state and selector properties for switching. Accordingly, the semiconductor device 100 does not further include a switching device or a resistive layer in addition to the selector layer 140. In some embodiments, the selector layer 140 is a single material layer in direct contact with the horizontal conductive layers 130 and the vertical conductive layer 150, but embodiments of the present inventive concept are not necessarily limited thereto. A thickness T1 of the selector layer 140 is, for example, in a range of about 10 nm to about 30 nm. When the thickness T1 of the selector layer 140 is greater than the above-described range, operating voltage can increase. When the thickness T1 is less than the above-described range, leakage current can increase.

The selector layer 140 includes a material layer whose resistance can change depending on a magnitude of voltage applied to opposite ends thereof. For example, the selector layer 140 includes an ovonic threshold switching (OTS) material. For example, the selector layer 140 includes a phase change material whose resistance changes depending on temperature. The selector layer 140 includes at least one of sulfur (S), selenium (Se), tellurium (Te), or arsenic (As).

In an embodiment, the selector layer 140 includes a chalcogenide material. Accordingly, the selector layer 140 includes, for example, at least one of a Group 16 element, such as sulfur (S), selenium (Se), or tellurium (Te). Alternatively, the selector layer 140 includes at least one of a Group 14 element, such as silicon (Si) or germanium (Ge), and a Group 15 element, such as arsenic (As) or antimony (Sb), or includes at least one in addition to the Group 16 element. In some embodiments, the selector layer 140 further includes a metallic material. In some embodiments, the selector layer 140 further includes at least one additional element of boron (B), carbon (C), nitrogen (N), or oxygen (O).

For example, the selector layer 140 may be formed of a single layer or multiple layers that include at least one binary material, such as GeSe, GeS, AsSe, AsTe, AsS SiTe, SiSe, SiS, GeAs, SiAs, SnSe, SnTe, etc., ternary material, such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, etc., quaternary material, such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, etc., quinary material, such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, etc., or senary material, such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, GeAsSeSAlSn, etc.

The vertical conductive layer 150 is disposed inside of the selector layer 140 and is surrounded by the selector layer 140. The vertical conductive layer 150 forms bit lines that are electrically connected to the plurality of memory cells. The vertical conductive layer 150 includes a conductive material, such as tungsten (W).

The isolation layers 160 extend in the Y-direction between vertical structures VS adjacent in, for example, the Y-direction, and pass through the stack structure ST. The isolation layers 160 divides the horizontal conductive layers 130 in the X-direction. The isolation layers 160 have a linear shape in a plan view. Isolation layers 160 that are arranged in one row in the Y-direction are spaced apart from each other with the vertical structures VS therebetween.

In embodiments, a width of each of the isolation layers 160 changes in a range smaller than the diameter D1 of the vertical structure VS. Ends of the isolation layers 160 in the Y-direction are in contact with external surfaces of the selector layers 140 of the vertical structures VS. The ends of the isolation layers 160 have a rounded shape along the external surfaces of the selector layers 140. The isolation layers 160 include an insulating material, such as one of silicon oxide, silicon nitride, or silicon oxynitride.

In the semiconductor device 100, the horizontal conductive layer 130 is divided by the isolation layers 160, thereby improving a degree of integration. As compared to a case in which the horizontal conductive layer 130 is not divided, parasitic capacitance between the horizontal conductive layers 130 can be reduced to prevent longer write latency. In addition, an area of each memory cell isreduced, which can reduce leakage current, thereby preventing a reduction in the read window.

Figure 2:
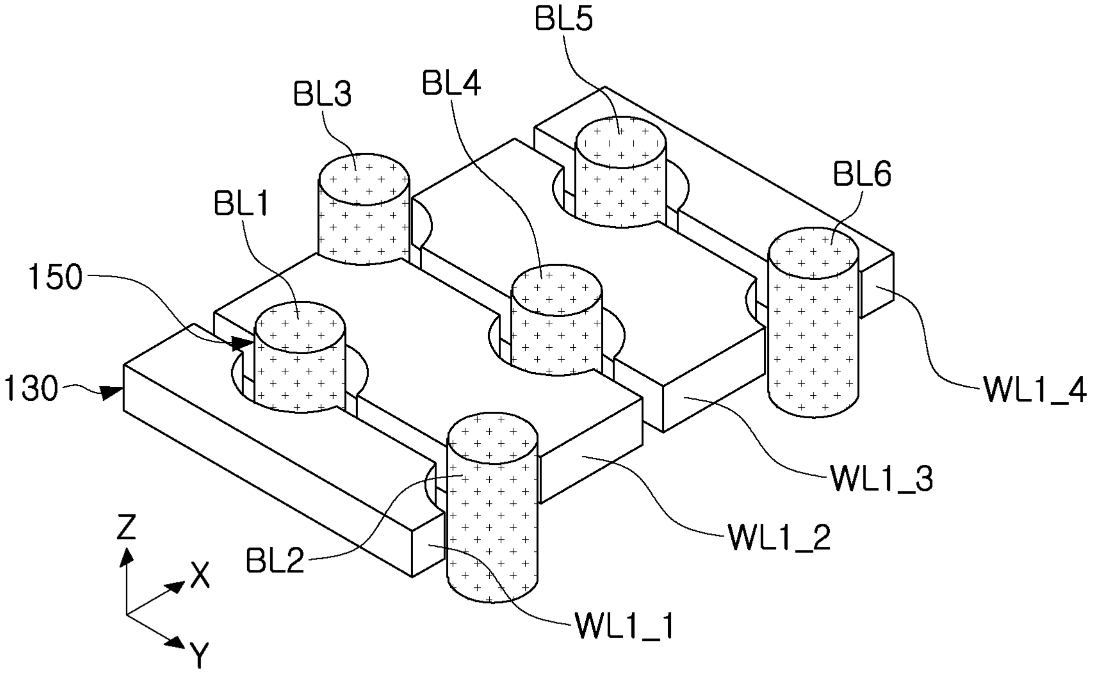
FIG. 2 is a schematic partial perspective view of a semiconductor device according to embodiments.

FIG. 2 is a schematic partial perspective view of a semiconductor device according to embodiments.

FIG. 2 illustrates one horizontal conductive layer 130 in the semiconductor device 100 of FIG. 1, and the vertical conductive layers 150 that intersect the horizontal conductive layer 130. The horizontal conductive layer 130 is divided into a plurality of sub conductive layers, and the sub conductive layers form first to fourth sub word planes WL1_1, WL1_2, WL1_3, and WL1_4. Each of the vertical conductive layers 150 forms, for example, first to sixth bit lines BL1, BL2, BL3, BL4, BL5, and BL6.

On a periphery of each of the first to sixth bit lines BL1, BL2, BL3, BL4, BL5, and BL6, two memory cells are formed by two of the first through fourth sub word planes WL1_1, WL1_2, WL1_3, and WL1_4, respectively. For example, one selector layer 140 in FIG. 1 forms two memory cells spaced apart from each other in an X-direction. The two memory cells share a bit line. For example, the first and third sub word planes WL1_1 and WL1_3 spaced apart from each other in the X-direction are electrically connected to each other, and the second and fourth sub word planes WL1_2 and WL1_4 spaced apart from each other in the X-direction are electrically connected to each other. Accordingly, a degree of integration of memory cells can be increased as compared to a case in which one horizontal conductive layer 130 extends, without being divided, to form one word plane.

Figure 3A:
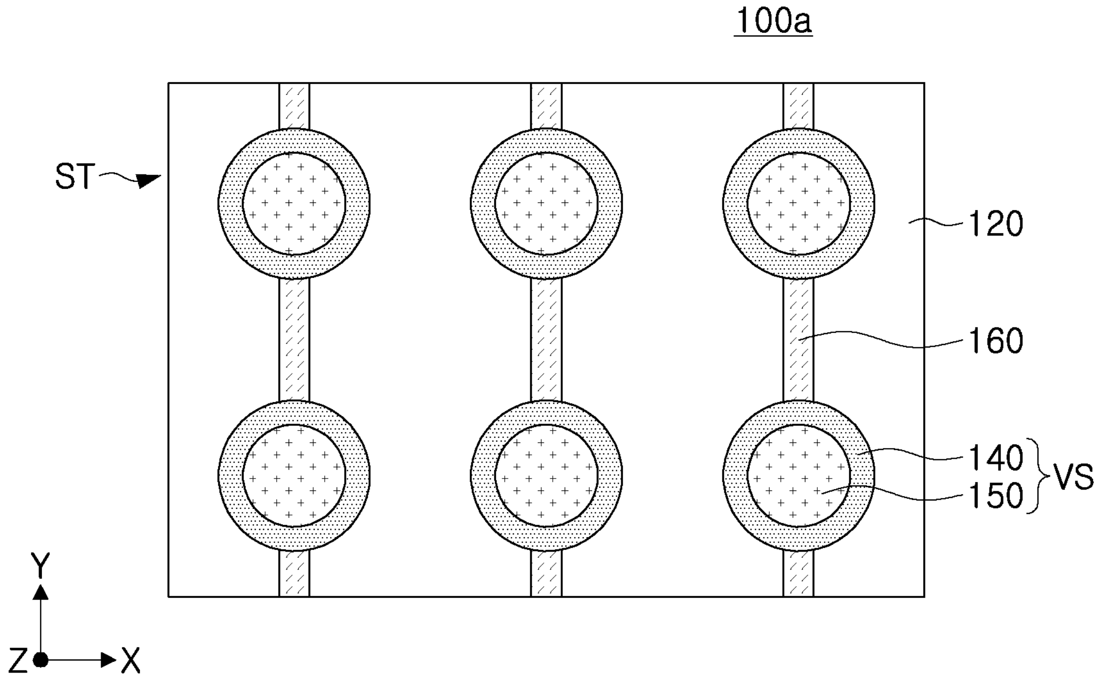
FIGS. 3A and 3B are schematic plan views of a semiconductor device according to embodiments.
Figure 3B:
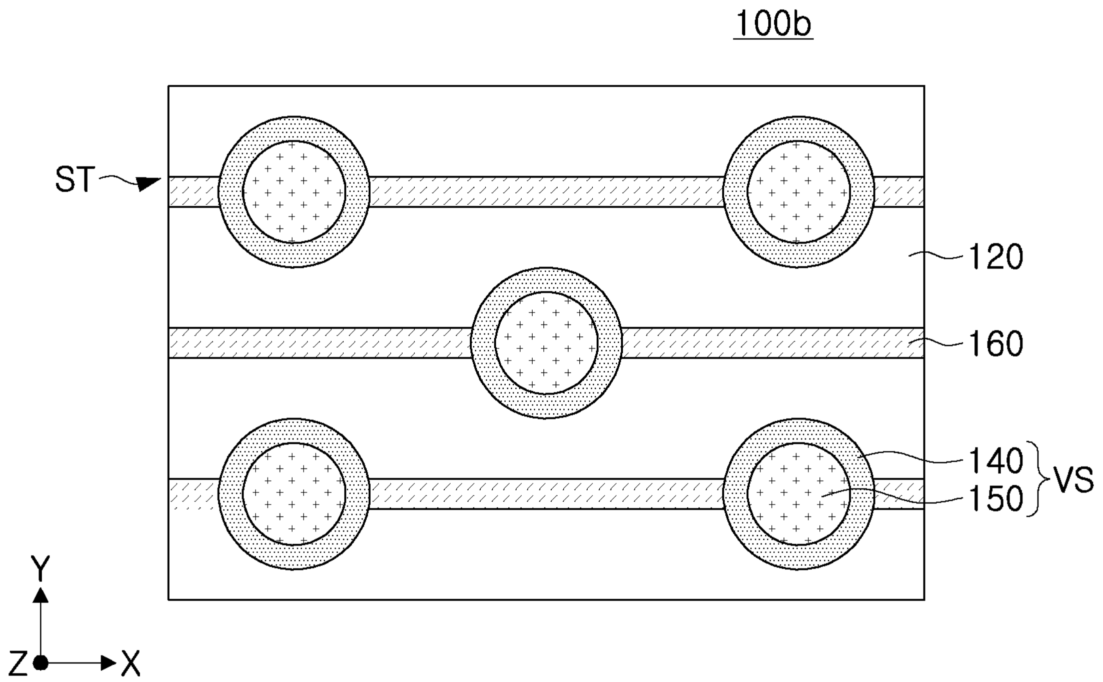

FIGS. 3A and 3B are schematic plan views of a semiconductor device according to embodiments.

Referring to FIG. 3A, in a semiconductor device 100*a* according to an embodiment, an arrangement of vertical structures VS differs from that of the embodiment of FIG. 1. The vertical structures VS are arranged next to each other in an X-direction and a Y-direction in parallel rows and columns, instead of in a zigzag shape. For example, in other embodiments, the arrangement of the vertical structures VS in a plan view can be changed in various ways.

Referring to FIG. 3B, in a semiconductor device 100*b* according to an embodiment, isolation layers 160 extend in the X-direction. Accordingly, the horizontal conductive layers 130 are divided from each other in the Y-direction.

Figure 4A:
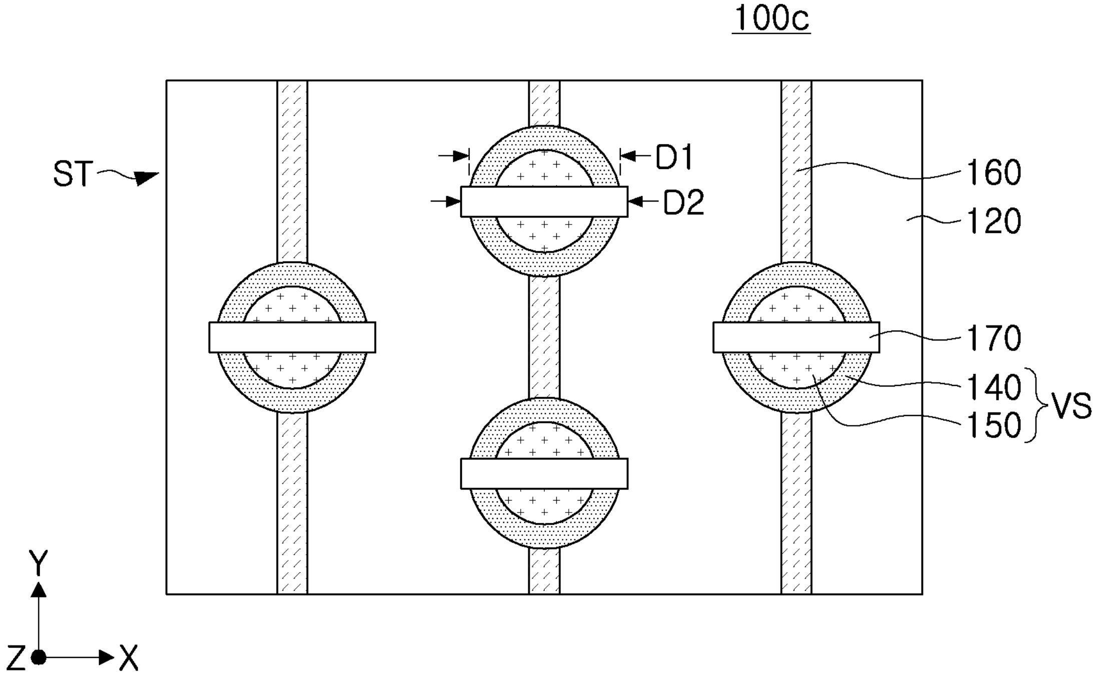
FIGS. 4A to 4C are schematic plan views of a semiconductor device according to embodiments.
Figure 4B:
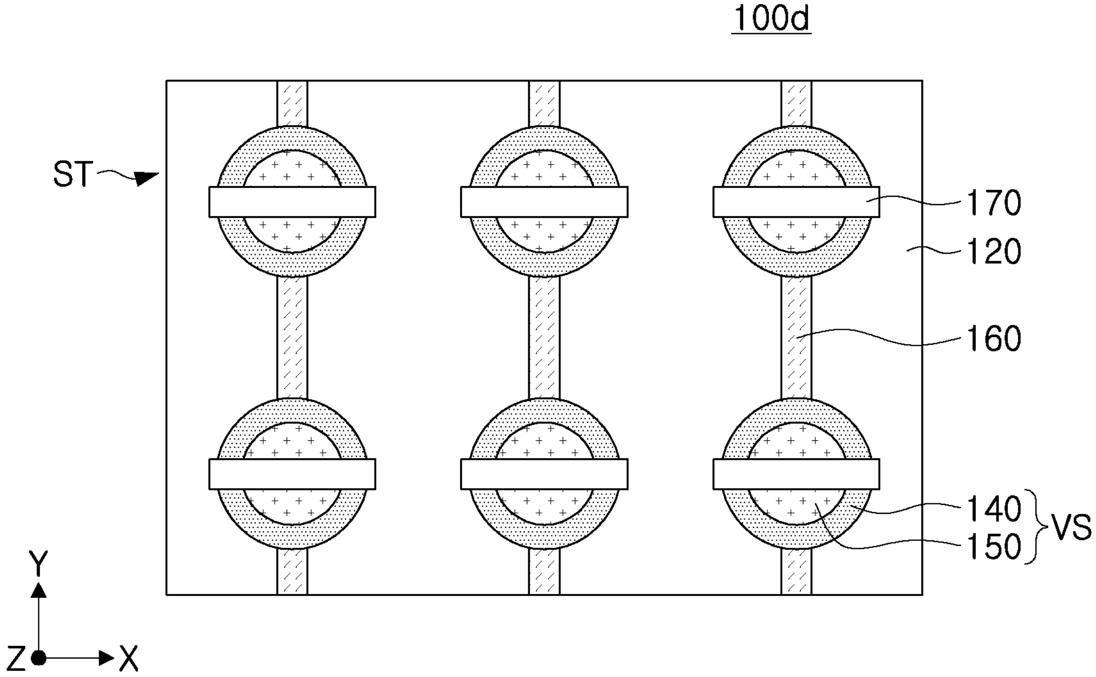
Figure 4C:
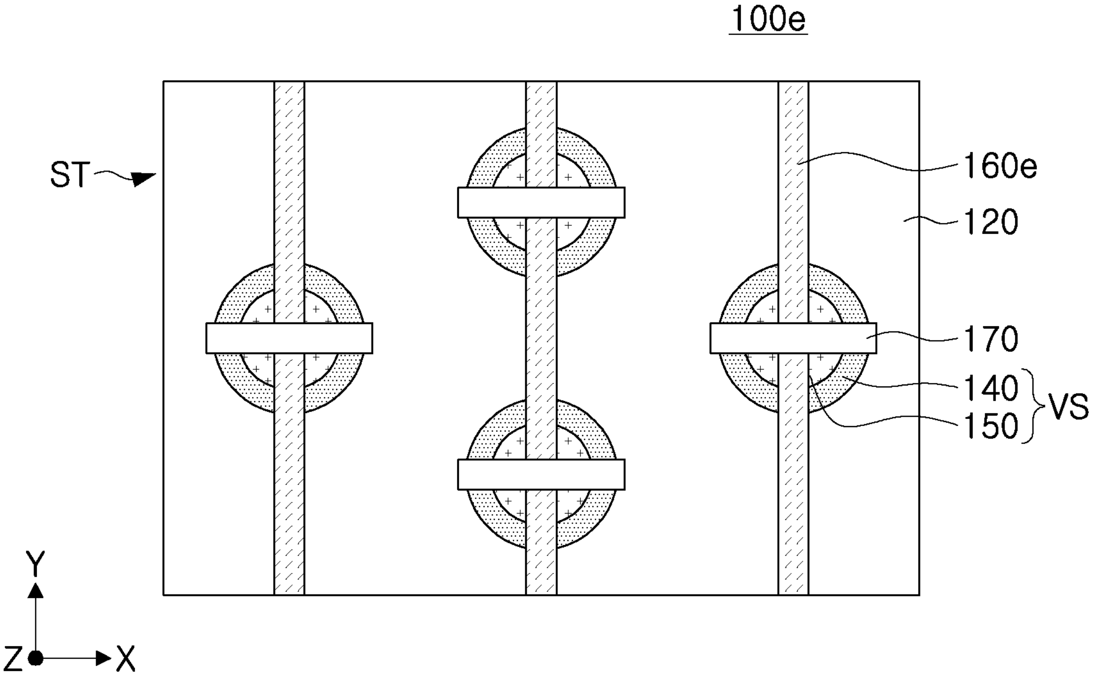

FIGS. 4A to 4C are schematic plan views of a semiconductor device according to embodiments.

Referring to FIG. 4A, a semiconductor device 100*c* according to an embodiment further includes second isolation layers 170 that divides the vertical structures VS. For example, the isolation layers 160 described above with reference to FIG. 1 may be referred to as first isolation layers.

The second isolation layers 170 extend in a direction that intersects an extension direction of the first isolation layers 160, such as an X-direction, and that divides the vertical structures VS. The second isolation layers 170 pass through the stack structure ST. The second isolation layers 170 divide the vertical conductive layers 150, and also divide the selector layers 140. The second isolation layers 170 are spaced apart from the first isolation layers 160.

A length D2 of the second isolation layer 170 is greater than a diameter D1 of the vertical structure VS. Accordingly, ends of the second isolation layer 170 in the X-direction are positioned outside of the selector layer 140. However, in some embodiments, the length D2 of the second isolation layer 170 is the same as the diameter D1 of the vertical structure VS. The second isolation layers 170 include an insulating material, such as one of silicon oxide, silicon nitride, or silicon oxynitride.

In an embodiment, four memory cells are formed in a region in which one vertical structure VS and one horizontal conductive layer 130 intersect each other. In one vertical structure VS, the vertical conductive layers 150 divided in the Y-direction can receive different electrical signals.

Referring to FIG. 4B, in a semiconductor device 100*d* according to an embodiment, vertical structures VS are arranged next to each other in an X-direction and a Y-direction, and the semiconductor device 100*d* further includes second isolation layers 170 that divide the vertical structures VS. The description provided above with reference to FIG. 4A also applies to the second isolation layers 170 of FIG. 4B.

Referring to FIG. 4C, in a semiconductor device 100*e* according to an embodiment, an arrangement of first isolation layers 160*e* differs from those of embodiments of FIGS. 1 and 4A. The first isolation layers 160*e* traverses at least a portion of vertical structures VS, instead of being disposed only between the vertical structures VS. The first isolation layers 160*e* are in contact with second isolation layers 170, and are spaced apart from each other in the Y-direction by the second isolation layers 170. In some embodiments, the first isolation layers 160*e* extend in the Y-direction while further dividing the second isolation layers 170.

In an embodiment, four memory cells are formed in a region in which one vertical structure VS and one horizontal conductive layer 130 intersect each other. In one vertical structure VS, vertical conductive layers 150 that are divided and disposed next to each other in the Y-direction can receive different electrical signals, and the vertical conductive layers 150 that are disposed in a diagonal direction can receive the same electrical signal, but embodiments of the present inventive concept are not necessarily limited thereto.

For example, the semiconductor device 100*e* has such a structure by first forming the vertical structures VS and then forming the first isolation layers 160*e* during a manufacturing process.

Figure 5A:
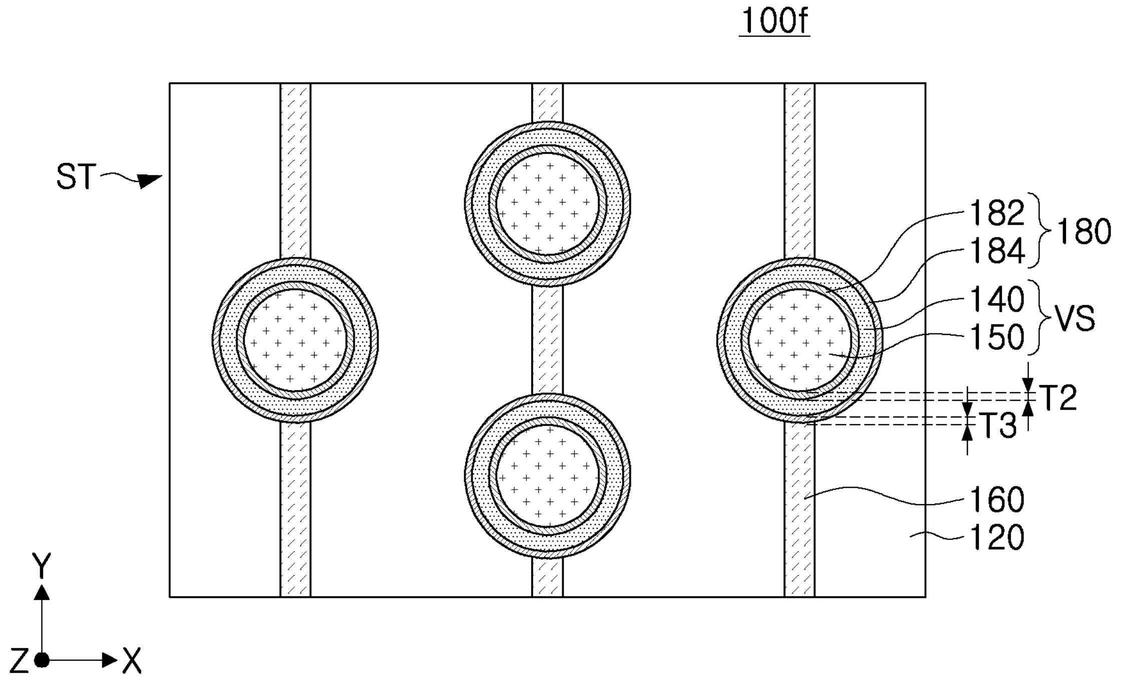
FIGS. 5A to 5C are schematic plan views of a semiconductor device according to embodiments.
Figure 5B:
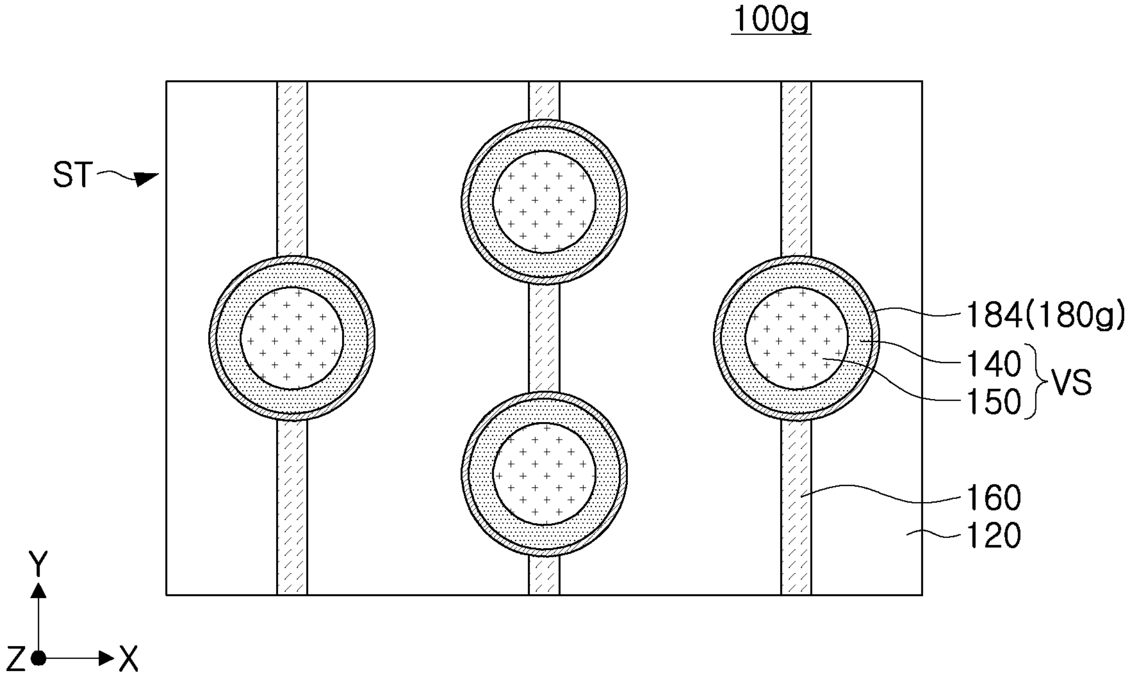
Figure 5C:
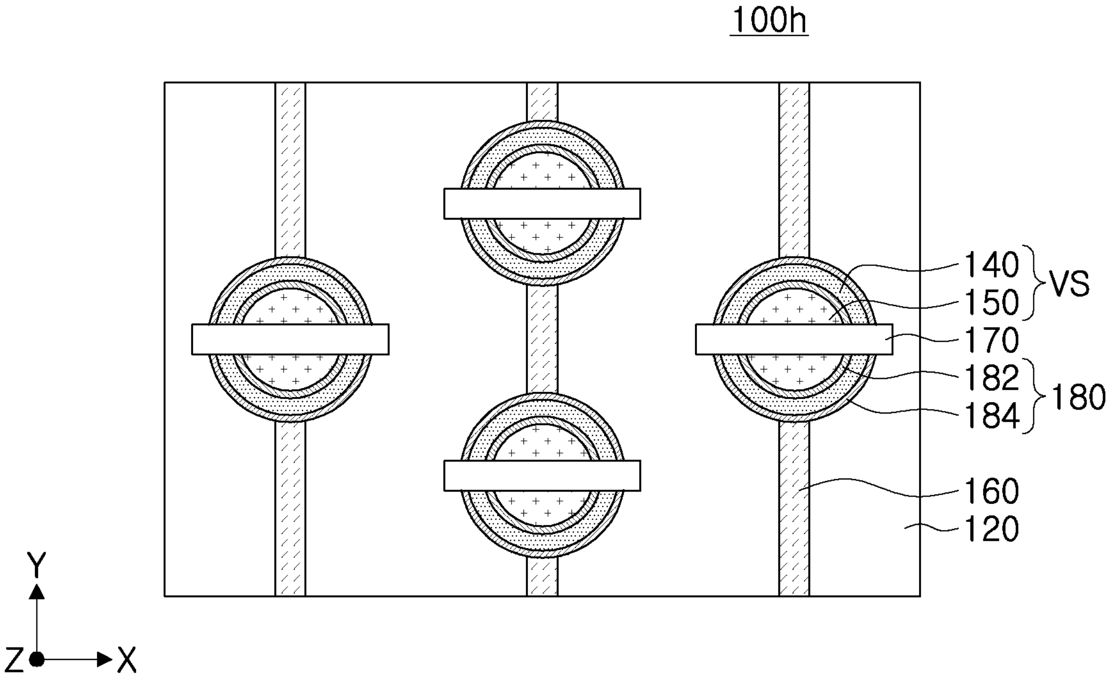

FIGS. 5A to 5C are schematic plan views of a semiconductor device according to embodiments.

Referring to FIG. 5A, a semiconductor device 100*f* according to an embodiment further includes barrier layers 180 disposed on internal and external surfaces of selector layers 140. The barrier layers 180 prevent contamination by interdiffusion between the selector layers 140 and horizontal conductive layers 130 and between the selector layers 140 and vertical conductive layers 150, and minimize leakage current. The barrier layers 180 vertically extend while passing through a stack structure ST along a vertical structure VS. For example, the barrier layers 180 are disposed in the vertical hole in which the vertical structure VS is disposed.

The barrier layers 180 include first and second barrier layers 182 and 184. The first barrier layer 182 is disposed on an internal surface of the selector layer 140, and is disposed between the selector layer 140 and the vertical conductive layer 150. The second barrier layer 184 is disposed on an external surface of the selector layer 140, and is disposed between the stack structure ST and the selector layer 140 and between the isolation layer 160 and the selector layer 140. A thickness T2 of the first barrier layer 182 may be the same as or different from a thickness T3 of the second barrier layer 184. For example, each of the thicknesses T2 and T3 are in a range of about 5 Å to about 30 Å. In some embodiments, the thickness T3 of the second barrier layer 184 is greater than the thickness T2 of the first barrier layer 182.

The barrier layers 180 includes an insulating material, and, for example, includes at least one of silicon oxide, silicon nitride, silicon oxynitride, aluminum oxide, zirconium oxide, or hafnium oxide.

Referring to FIG. 5B, in a semiconductor device 100*g* according to an embodiment, a barrier layer 180*g* includes only a second barrier layer 184 disposed on an external surface of a selector layer 140. This arrangement, in which the barrier layer 180*g* is disposed only on the external surface of the selector layer 140, has a relatively large lateral area in consideration of leakage current.

Referring to FIG. 5C, a semiconductor device 100*h* according to an embodiment includes both barrier layers 180 and second isolation layers 170. For example, in one vertical structure VS, the barrier layer 180 is divided by the second isolation layer 170. As such, the barrier layers 180 may be additionally applied to other embodiments.

FIGS. 6A to 6D are schematic perspective views that illustrate a method of manufacturing a semiconductor device according to embodiments.

Figure 6A:
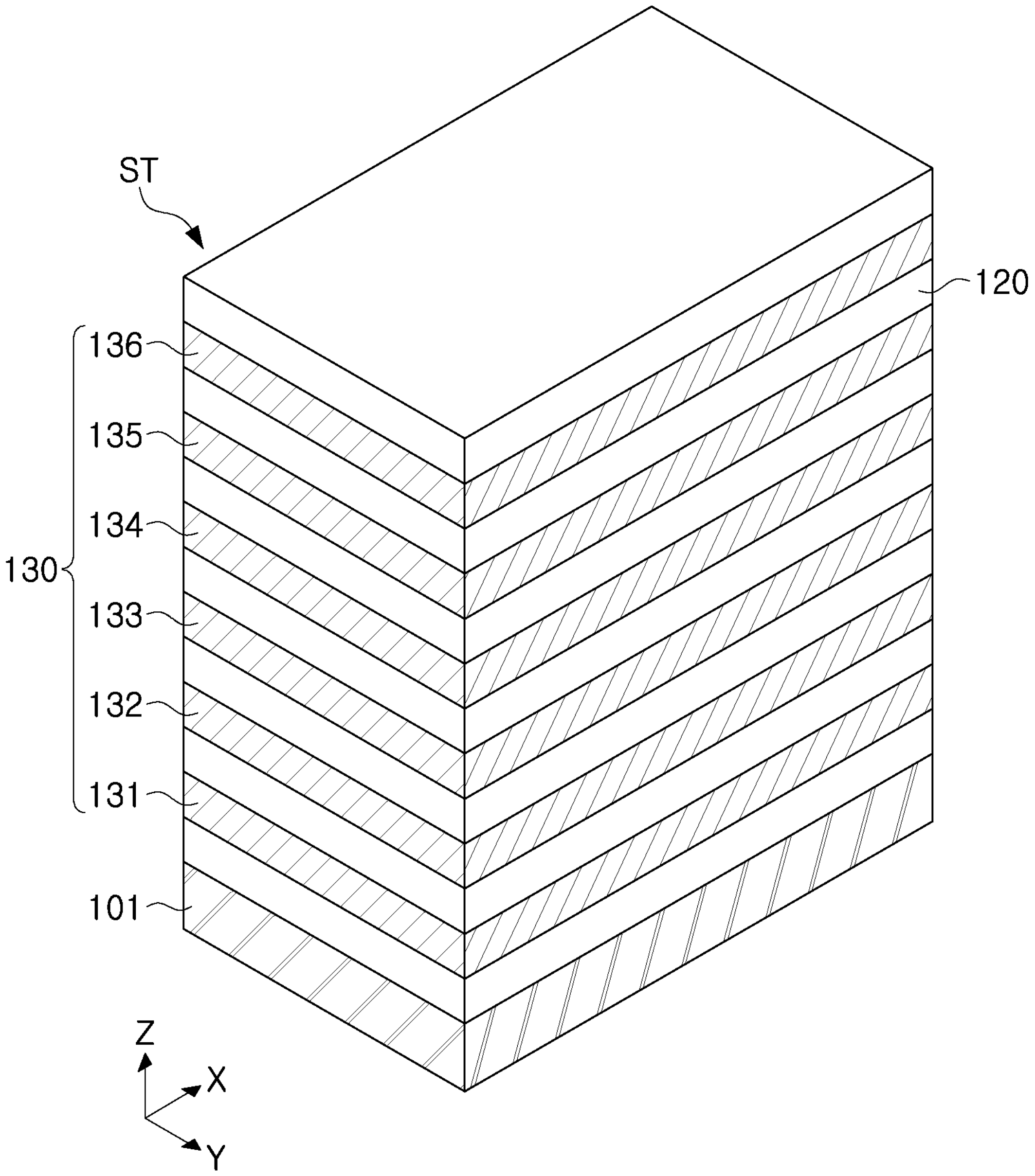
FIGS. 6A to 6D are schematic perspective views that illustrate a method of manufacturing a semiconductor device according to embodiments.

Referring to FIG. 6A, in an embodiment, a stack structure ST is formed by alternately stacking horizontal conductive layers 130 and interlayer insulating layers 120.

After the interlayer insulating layer 120 is first formed on a substrate 101, the horizontal conductive layers 130 and the interlayer insulating layers 120 are alternately deposited and stacked. In embodiments, the interlayer insulating layers 120 might not all have the same thickness. In embodiments, the thicknesses of the interlayer insulating layers 120 and the horizontal conductive layers 130 and the number of constituent films of the interlayer insulating layers 120 and the horizontal conductive layers 130 may vary from those illustrated.

Figure 6B:
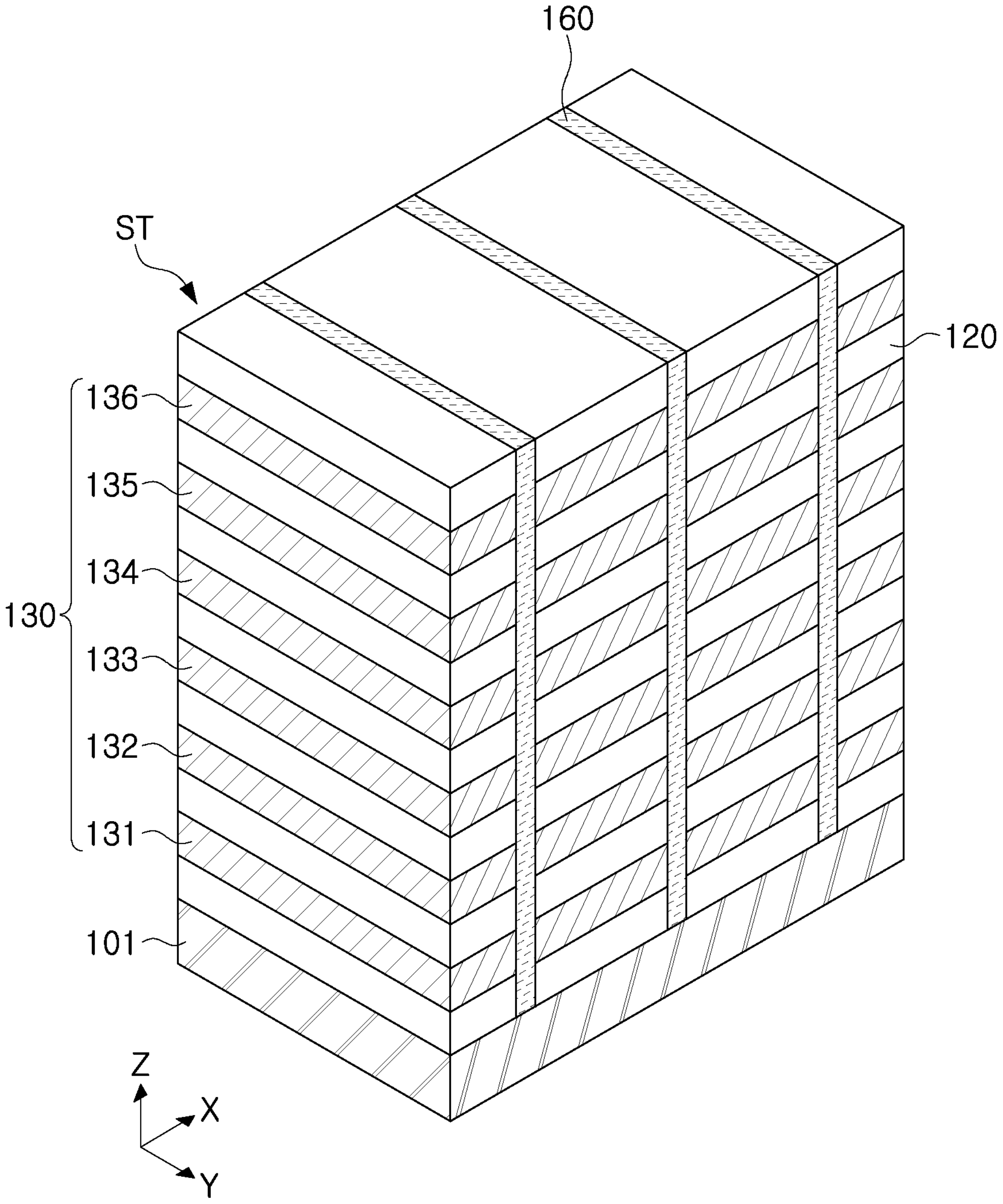

Referring to FIG. 6B, in an embodiment, isolation layers 160 are formed that pass through the stack structure ST and have a linear shape.

The isolation layers 160 extend in the Y-direction and are spaced apart from each other in the X-direction. The isolation layers 160 are formed by forming trenches that pass-through the stack structure ST and then depositing an insulating material into the trenches.

Figure 6C:
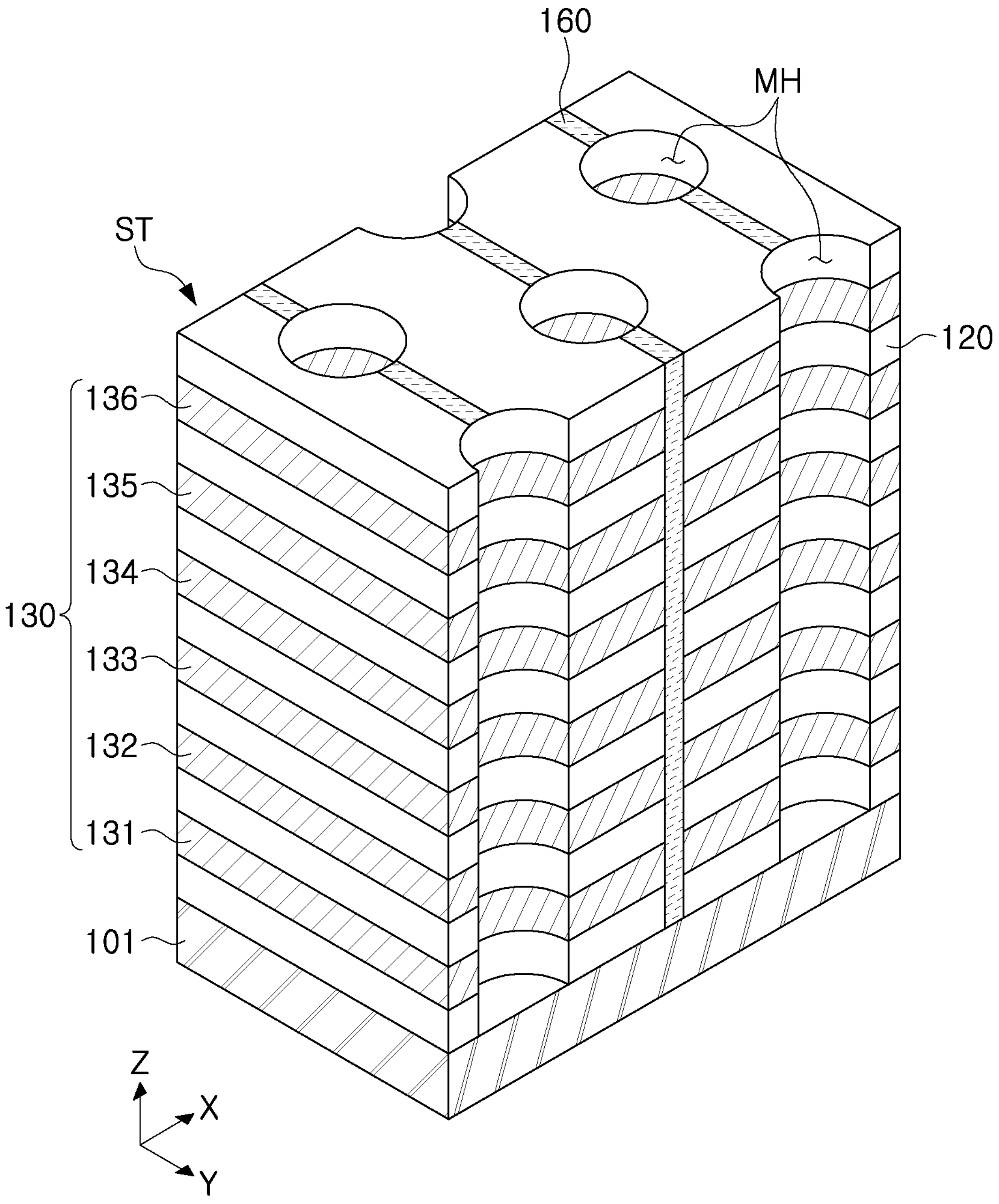

Referring to FIG. 6C, in an embodiment, through-holes MH are formed that vertically extend through the stack structure ST.

The through-holes MH are formed at positions that correspond to those of the vertical structures VS of FIG. 1. The through-holes MH extend onto the substrate 101 through the stack structure ST. Due to a height of the stack structure ST, sidewalls of the through-holes MH might not be perpendicular to an upper surface of the substrate 101. In some embodiments, the through-holes MH are formed to recess a portion of the substrate 101.

Figure 6D:
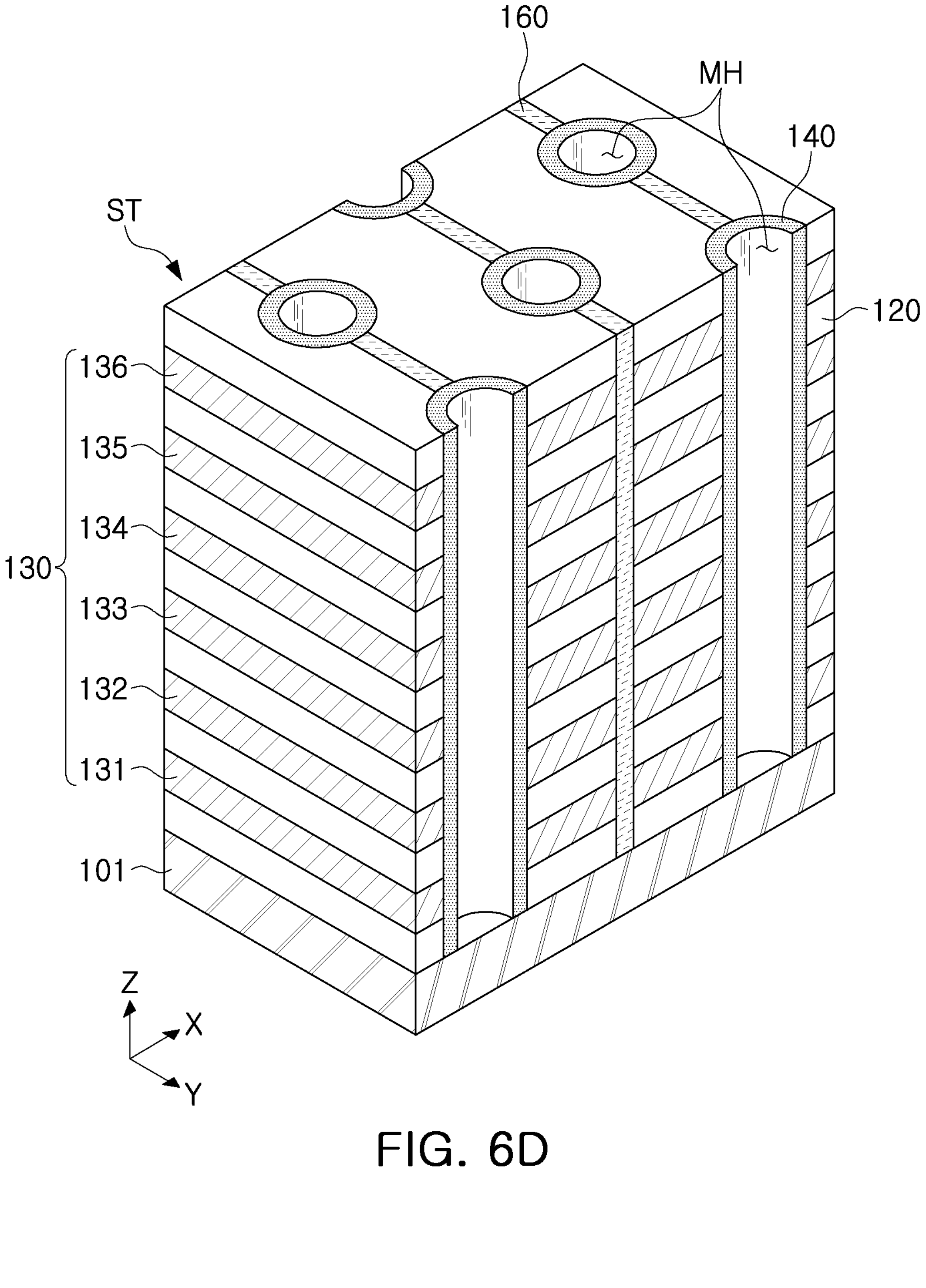

Referring to FIG. 6D, in an embodiment, selector layers 140 are formed in the through-holes MH.

The selector layers 140 are formed to have a uniform thickness by using, for example, an atomic layer deposition (ALD) or chemical vapor deposition (CVD) process. The selector layers 140 are removed from the upper surface of the substrate 101.

Subsequently, referring to FIG. 1 together, vertical structures VS are formed by forming vertical conductive layers 150 that fill the through-holes MH.

The vertical conductive layers 150 are formed to fill the inside of the selector layers 140. The vertical conductive layers 150 are formed, for example, by depositing a conductive material and then removing the conductive material from the upper surface of the stack structure ST using a chemical mechanical polishing (CMP) process, etc.

As a result, the semiconductor device 100 of FIG. 1 can be manufactured. Thereafter, interconnection structures that are connected to the horizontal conductive layers 130 and the vertical conductive layers 150 are further formed.

Figure 7A:
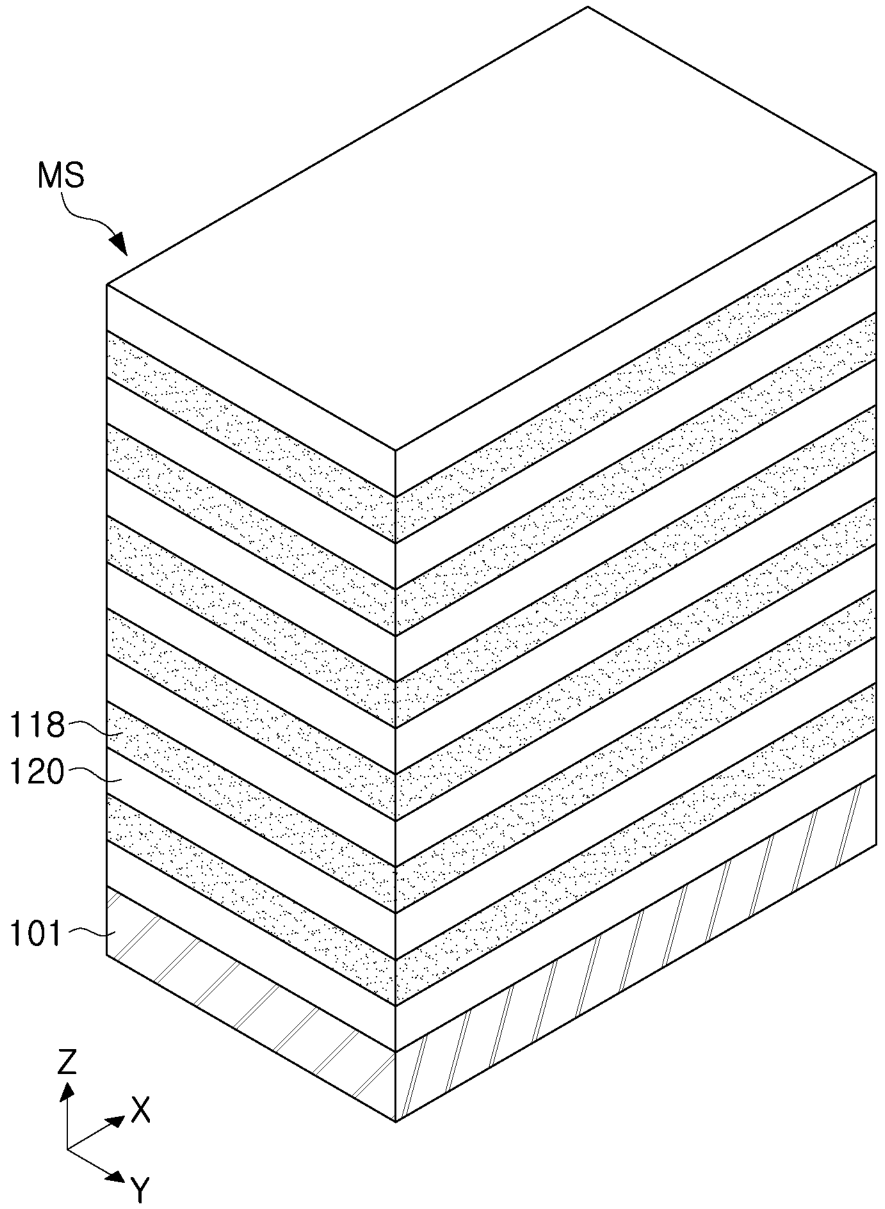
FIGS. 7A to 7C are schematic perspective views that illustrate a method of manufacturing a semiconductor device according to embodiments.
Figure 7B:
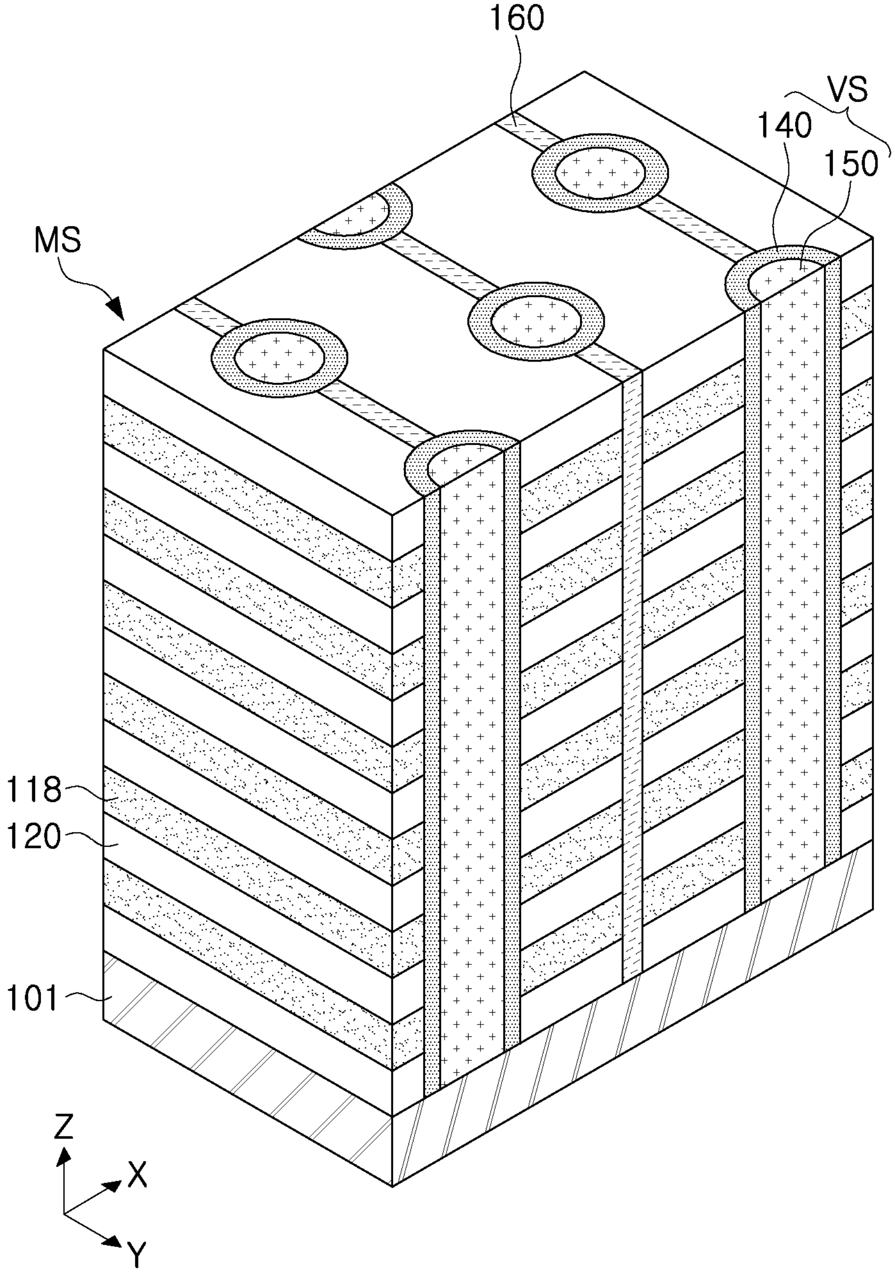
Figure 7C:
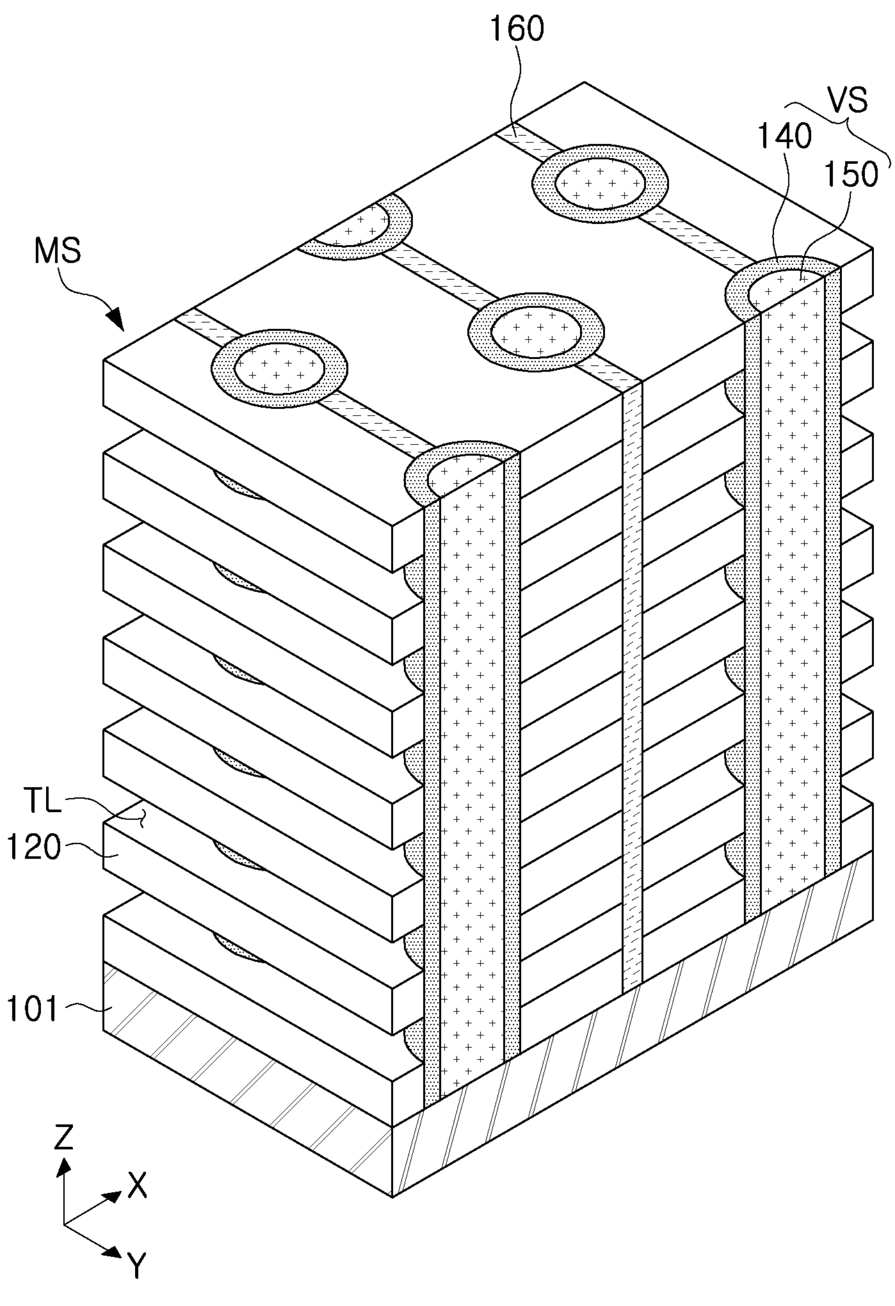

FIGS. 7A to 7C are schematic perspective views that illustrate a method of manufacturing a semiconductor device according to embodiments.

Referring to FIG. 7A, in an embodiment, a mold structure MS is formed by alternately stacking sacrificial insulating layers 118 and interlayer insulating layers 120.

The sacrificial insulating layers 118 are replaced with horizontal conductive layers 130 (see FIG. 1) in a subsequent process. The sacrificial insulating layers 118 are formed of a material that differs from that of the interlayer insulating layers 120, and are formed of a material that has etch selectivity with respect to the interlayer insulating layers 120 under specific etching conditions. For example, the interlayer insulating layers 120 are formed of at least one of silicon oxide or silicon nitride, and the sacrificial insulating layers 118 are formed of at least one of silicon, silicon oxide, silicon carbide, or silicon nitride, which differs from that of the interlayer insulating layers 120.

Referring to FIG. 7B, in an embodiment, isolation layers 160 and vertical structures VS are formed that pass through the mold structure MS.

The isolation layers 160 are formed first, and then the vertical structures VS are formed. The isolation layers 160 and the vertical structures VS are formed by a process described above with reference to FIGS. 6B to 6D.

Referring to FIG. 7C, in an embodiment, tunnel portions TL are formed by removing the sacrificial insulating layers 118 from the mold structure MS.

A trench-shaped opening that passes through the mold structure MS is separately formed, and then the sacrificial insulating layers 118 are removed through the opening. The sacrificial insulating layers 118 are selectively removed with respect to the interlayer insulating layers 120 by using, for example, wet etching. Accordingly, a plurality of tunnel portions TL are formed between the interlayer insulating layers 120.

Subsequently, referring to FIG. 1 together, the horizontal conductive layers 130 are formed in the tunnel portions TL.

A conductive material that forms the horizontal conductive layers 130 is deposited to fill the tunnel portions TL. The conductive material include at least one of a metal, polycrystalline silicon, or a metal silicide material.

As a result, the semiconductor device 100 of FIG. 1 can be manufactured. Thereafter, interconnection structures that are connected to the horizontal conductive layers 130 and vertical conductive layers 150 are further formed.

Figure 8:
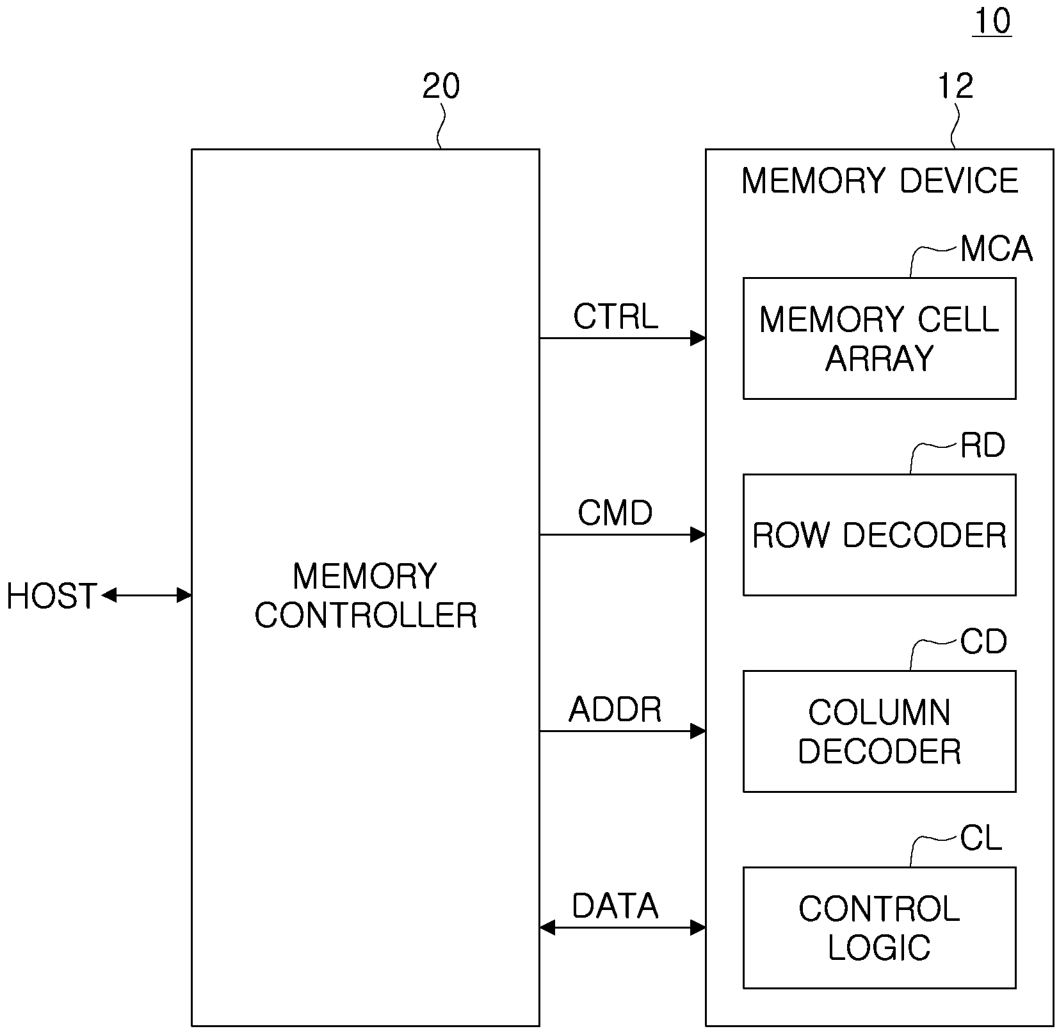
FIG. 8 is a block diagram of a memory system that includes a semiconductor device according to embodiments.

FIG. 8 is a block diagram of a memory system that includes a semiconductor device according to embodiments.

Referring to FIG. 8, in an embodiment, a memory system 10 includes a memory device 12 and a memory controller 20. The memory device 12 includes a memory cell array MCA, a row decoder RD, a column decoder CD, and a control logic CL.

The memory controller 20 controls the memory device 12 to read data from the memory device 12 or write data to the memory device 12 in response to a write/read request from a host HOST. The memory controller 20 provides an address ADDR, a command CMD, and a control signal CTRL to the memory device 12, thereby controlling program (or write), read, and erase operations for the memory device 12. In addition, data DATA to be written and data DATA to be read are transmitted and received between the memory controller 20 and the memory device 12.

The memory cell array MCA includes a plurality of memory cells respectively disposed in regions in which a plurality of first signal lines and a plurality of second signal lines intersect each other. In embodiments, the plurality of first signal lines is a plurality of bit lines, and the plurality of second signal lines is a plurality of word lines. In other embodiments, the plurality of first signal lines is a plurality of word lines, and the plurality of second signal lines is a plurality of bit lines. Each of the plurality of memory cells includes at least one of a single level cell SLC that stores one bit, a multilevel cell MLC that stores at least two bits of data, or a combination thereof. The memory cell array MCA includes single selector memory cells that include the selector layer 140 of FIG. 1.

The row decoder RD drives the plurality of word lines that form the memory cell array MCA, and the column decoder CD drives the plurality of bit lines that form the memory cell array MCA. The row decoder RD includes a decoding means that decodes a row address and a switch means that controls switching in response to various row control signals according to a decoding result. The column decoder CD includes a decoding means that decodes a column address and a switch means that controls switching in response to various column control signals according to a decoding result.

The control logic CL controls an overall operation of the memory device 12, and controls the row decoder RD and the column decoder CD to select a memory cell from the memory cell array MCA. For example, the control logic CL generates a row address and a column address by processing an external address. The memory device 12 includes a power generating means that generates various write voltages and read voltages used for write and read operations, and a write voltage and a read voltage are provided to a memory cell through the row decoder RD and the column decoder CD under the control of the control logic CL.

Figure 9:
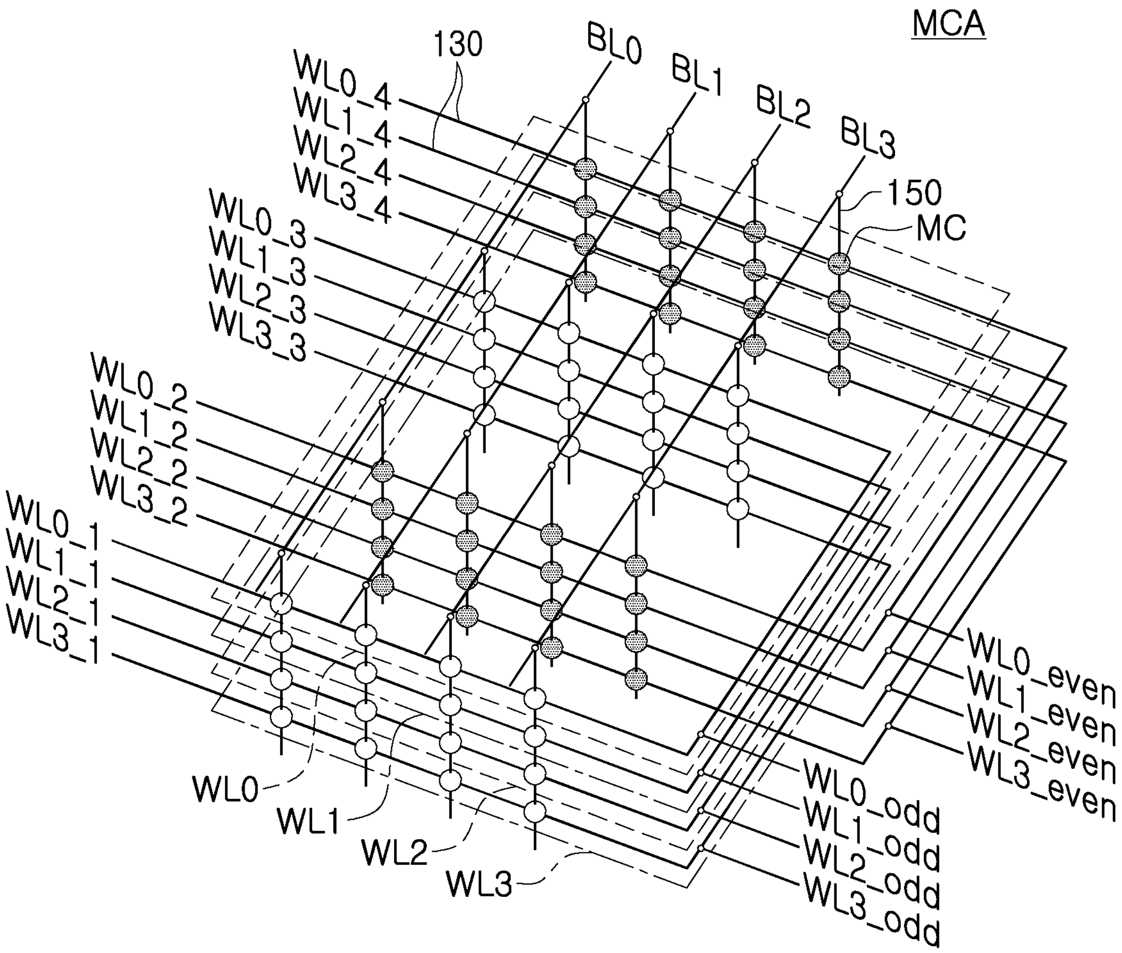
FIG. 9 is a schematic diagram of a memory cell array of a memory system according to embodiments.

FIG. 9 is a schematic diagram of a memory cell array of a memory system according to embodiments.

Referring to FIG. 9, in an embodiment, a memory cell array MCA includes a plurality of cell regions, and FIG. 9 illustrates one cell region of the plurality of cell regions. The memory cell array MCA includes a plurality of word lines WL0, WL1, WL2, and WL3, a plurality of bit lines BL0, BL1, BL2, and BL3, and a plurality of memory cells MC.

The plurality of word lines WL0, WL1, WL2, and WL3 are disposed on different levels, and correspond to the horizontal conductive layers 130 of FIG. 1. Each of the plurality of bit lines BL0, BL1, BL2, and BL3 includes a plurality of vertical conductive layers 150 that are vertically disposed. Each of the plurality of memory cells MC is disposed at an intersection point between the one of plurality of word lines WL0, WL1, WL2, and WL3 and one of the plurality of bit lines BL0, BL1, BL2, and BL3, such as an intersection point between one of the plurality of word lines WL0, WL1, WL2, and WL3, and one of the vertical conductive layers 150. The plurality of memory cells MC are three-dimensionally arranged. In embodiments, the number of word lines, the number of bit lines, and the number of memory cells MC can vary.

The plurality of word lines WL0, WL1, WL2, and WL3 includes a plurality of sub word lines WL0_1, WL0_2, WL0_3, WL0_4, WL1_1, WL1_2, WL1_3, WL1_4, WL2_1, WL2_2, WL2_3, WL2_4, WL3_1, WL3_2, WL3_3, and WL3_4, respectively. In an embodiment, four sub word lines are illustrated per word line, but embodiments of the present inventive concept are not necessarily limited thereto. In an embodiment, of the plurality of sub word lines WL0_1, WL0_2, WL0_3, WL0_4, WL1_1, WL1_2, WL1_3, WL1_4, WL2_1, WL2_2, WL2_3, WL2_4, WL3_1, WL3_2, WL3_3, and WL3_4, first sub word lines WL0_1, WL1_1, WL2_1, and WL3_1 and third sub word lines WL0_3, WL1_3, WL2_3, and WL3_3 that are spaced apart from each other are respectively electrically connected to each other at the same height to form odd-numbered word lines WL0_odd, WL1_odd, WL2_odd, and WL3_odd. In addition, second sub word lines WL0_2, WL1_2, WL2_2, and WL3_2 and fourth sub word lines WL0_4, WL1_4, WL2_4, and WL3_4 that are spaced apart from each other are respectively electrically connected to each other at the same height to form even-numbered word lines WL0_even, WL1_even, WL2_even, and WL3_even.

Each of the plurality of memory cells MC includes a selector layer 140 (see FIG. 1). One selector layer 140 is electrically connected to two of the sub word lines WL0_1, WL0_2, WL0_3, WL0_4, WL1_1, WL1_2, WL1_3, WL1_4, WL2_1, WL2_2, WL2_3, WL2_4, WL3_1, WL3_2, WL3_3, and WL3_4, and is electrically connected to one of the plurality of bit lines BL0, BL1, BL2, and BL3.

To drive a memory device 12 (see FIG. 8), voltage is applied to a selector layer 140 of a memory cell MC through a plurality of word lines WL0, WL1, WL2, and WL3 and a plurality of bit lines BL0, BL1, BL2, and BL3, causing current to flow. The selector layer 140 is changed into one of a plurality of resistance states by an applied electrical pulse. In embodiments, the selector layer 140 includes a phase change material whose crystalline state changes depending on an amount of current. The phase change material may be changed into an amorphous state that has a relatively high resistance or a crystalline state that has a relatively low resistance. A phase of the phase change material is changed by Joule's heat generated by the amount of current, and data can be written using such a phase change.

An arbitrary memory cell MC can be addressed by selecting one of the plurality of word lines WL0, WL1, WL2, and WL3 and one of the plurality of bit lines BL0, BL1, BL2, and BL3, and the memory cell MC is programmed by applying a predetermined signal between the selected word line and the selected bit line. In addition, a current value can be measured through the plurality of bit lines BL0, BL1, BL2, and BL3, thereby reading information of a resistance value of a corresponding memory cell MC, such as programmed information.

A semiconductor device includes an isolation layer that divides a horizontal conductive layer or a word plane, and thus has an increased degree of integration and reliability.

The various effects of embodiments of the present inventive concept are not limited to those set forth herein, and will be more easily understood in the course of describing specific embodiments.

While embodiments have been illustrated and described above, it will be apparent to those skilled in the art that modifications and variations could be made without departing from the scope of embodiments of the present inventive concept as defined by the appended claims.

What is claimed is:

1. A semiconductor device, comprising:

a stack structure that includes horizontal conductive layers and interlayer insulating layers that are alternately stacked with each other in a first direction;

vertical conductive layers that pass through the stack structure and extend in the first direction, wherein the vertical conductive layers have a pillar shape;

selector layers that surround external surfaces of the vertical conductive layers, wherein the selector layers include a chalcogenide material; and first isolation layers that divide the horizontal conductive layers from each other and passthrough the stack structure between vertical conductive layers that are adjacent to each other in a second direction that is perpendicular to the first direction, wherein ends of the first isolation layers in the second direction are in contact with external surfaces of the selector layers; and second isolation layers that extend in a third direction that intersects the second direction and pass through the stack structure, wherein each vertical structure includes one of the vertical conductive layers and one of the selector layers surrounding the one of the vertical conductive layers, wherein the second isolation layers divide the vertical conductive layers and the selector layers and are spaced apart from the first isolation layers, and wherein a length of each of the second isolation layers in the third direction is greater than an outer diameter of a corresponding vertical structure defined by opposite external surfaces of a corresponding one of the selector layers in the third direction such that opposite ends of each of the second isolation layers are positioned outside of the corresponding one of the selector layers.

2. The semiconductor device of claim 1, wherein in a third direction that is perpendicular to the first and second directions, each of the horizontal conductive layers includes first to fourth sub conductive layers divided from each other, and the first and third sub conductive layers are electrically connected to each other, and the second and fourth sub conductive layers are electrically connected to each other.

3. The semiconductor device of claim 1, wherein the selector layers extend on the external surfaces of the vertical conductive layers and surround the entire external surfaces of the vertical conductive layers.

4. The semiconductor device of claim 1, wherein the external surfaces of the selector layers are in direct contact with the horizontal conductive layers, and internal surfaces of the selector layers are in direct contact with the vertical conductive layers.

5. The semiconductor device of claim 1, further comprising:

the third direction is perpendicular to the first and second directions.

6. The semiconductor device of claim 1, further comprising:

barrier layers that cover at least one of internal surfaces or the external surfaces of the selector layers.

7. The semiconductor device of claim 6, wherein the barrier layers include an oxide or a nitride.

8. The semiconductor device of claim 6, wherein the barrier layers have a first thickness on the internal surfaces of the selector layers, and have a second thickness that differs from the first thickness on the external surfaces of the selector layers.

9. The semiconductor device of claim 1, wherein a thickness of each of the selector layers is in a range from about 10 nm to about 30 nm.

10. The semiconductor device of claim 1, wherein the selector layers include at least one of sulfur(S), selenium (Se), tellurium (Te), or arsenic (As).

11. The semiconductor device of claim 1, wherein the horizontal conductive layers and the vertical conductive layers include a metal.

12. A semiconductor device, comprising:

a stack structure that includes horizontal conductive layers and interlayer insulating layers that are alternately stacked with each other in a first direction;

vertical structures that pass through the stack structure and extend in the first direction, wherein the vertical structures include a selector layer and a vertical conductive layer that are sequentially disposed from the horizontal conductive layers; and isolation layers that extending in a second direction that is perpendicular to the first direction, wherein the isolation layers divide the horizontal conductive layers from each other, wherein the isolation layers are spaced apart from each other with the vertical structures interposed therebetween and between the vertical structures arranged in a row in the second direction; and second isolation layers that extend in a third direction that intersects the second direction and pass through the stack structure, wherein the second isolation layers divide vertical conductive layers and selector layers of adjacent vertical structures and are spaced apart from the isolation layers, and wherein a length of each of the second isolation layers in the third direction is greater than an outer diameter of a corresponding one of the vertical structures defined by opposite external surfaces of the selector layer of the corresponding one of the vertical structures in the third direction such that opposite ends of each of the second isolation layers are positioned outside of the selector layer of the corresponding one of the vertical structures.

13. The semiconductor device of claim 12, wherein the horizontal conductive layers form a word plane and the vertical conductive layer forms a bit line.

14. The semiconductor device of claim 12, wherein the selector layer operates as a selector, and has a changing resistance.

15. The semiconductor device of claim 13, wherein the selector layer is a single material layer and is in direct contact with the horizontal conductive layers and the vertical conductive layer.

16. The semiconductor device of claim 13, wherein ends of the isolation layers in the second direction that are in contact with the vertical structures have a rounded shape along the vertical structures.

17. A semiconductor device, comprising:

a stack structure that includes horizontal conductive layers and interlayer insulating layers that are alternately stacked with each other in a first direction;

vertical structures that pass through the stack structure and extend in the first direction, wherein the vertical structures include a selector layer and a vertical conductive layer that are sequentially disposed from the horizontal conductive layers; and isolation layers that extend in a second direction that is perpendicular to the first direction, wherein the isolation layers extend between adjacent vertical structures and divide the horizontal conductive layers into sequentially disposed first to fourth sub conductive layers, wherein the first and third sub conductive layers are electrically connected to each other, and the second and fourth sub conductive layers are electrically connected to each other; and second isolation layers that extend in a third direction that intersects the second direction and pass through the stack structure, wherein the second isolation layers divide vertical conductive layers and selector layers of adjacent vertical structures and are spaced apart from the isolation layers, and wherein a length of each of the second isolation layers in the third direction is greater than an outer diameter of a corresponding one of the vertical structures defined by opposite external surfaces of the selector layer of the corresponding one of the vertical structures in the third direction such that opposite ends of each of the second isolation layers are positioned outside of the selector layer of the corresponding one of the vertical structures.

18. The semiconductor device of claim 17, wherein the selector layer forms four memory cells between the selector layer and the respective horizontal conductive layers.

19. The semiconductor device of claim 1, wherein four memory cells are formed by one of the vertical structures and one of the horizontal conductive layers.

20. The semiconductor device of claim 12, wherein four memory cells are formed by one of the vertical structures and one of the horizontal conductive layers.

* * * * *